US011955363B2

United States Patent
Amit et al.

(10) Patent No.: US 11,955,363 B2
(45) Date of Patent: Apr. 9, 2024

(54) BONDING FIXTURE

(71) Applicant: ROCKLEY PHOTONICS LIMITED, Altrincham (GB)

(72) Inventors: Moshe Amit, Los Angeles, CA (US); Chia-Te Chou, Brea, CA (US); Arvind Jaikumar, Rancho Cucamonga, CA (US)

(73) Assignee: Rockley Photonics Limited, Altrincham (GB)

( * ) Notice: Subject to any disclaimer, the term of this patent is extended or adjusted under 35 U.S.C. 154(b) by 0 days.

(21) Appl. No.: 17/742,095

(22) Filed: May 11, 2022

(65) Prior Publication Data

US 2022/0367235 A1 Nov. 17, 2022

Related U.S. Application Data

(60) Provisional application No. 63/187,845, filed on May 12, 2021.

(51) Int. Cl.
*H01L 21/683* (2006.01)
*H01L 21/67* (2006.01)
*H01L 21/687* (2006.01)

(52) U.S. Cl.
CPC .... *H01L 21/6838* (2013.01); *H01L 21/67092* (2013.01); *H01L 21/6875* (2013.01); *H01L 21/68757* (2013.01); *H01L 21/68785* (2013.01)

(58) Field of Classification Search
CPC ... B25B 11/00; B25B 11/005; H01L 21/6838; H01L 21/67092; H01L 21/68757; H01L 21/6875; H01L 21/68785; H01L 21/68735; H01L 2924/00; B23Q 3/08; B23Q 3/088
USPC ............ 269/20, 21, 35, 289 R, 900; 29/559; 279/3
See application file for complete search history.

(56) References Cited

U.S. PATENT DOCUMENTS

2021/0074575 A1* 3/2021 Yamamoto ............. B23K 26/38

FOREIGN PATENT DOCUMENTS

CN 103962729 A * 8/2014 ............. B23K 26/08

OTHER PUBLICATIONS

CN103962729—Machine Translation (Year: 2014).*

* cited by examiner

*Primary Examiner* — Lee D Wilson
*Assistant Examiner* — Alberto Saenz
(74) *Attorney, Agent, or Firm* — Lewis Roca Rothgerber Christie LLP

(57) ABSTRACT

A bonding fixture. In some embodiments, the fixture includes: a plate for supporting a central region of the wafer, the central region including 80% of the area of the wafer; and a frame for supporting: the edge of the wafer, and the edge of the plate, the frame having: a first vacuum passage, for pulling the wafer against an upper surface of the frame, and a second vacuum passage, for pulling the plate against the frame.

17 Claims, 5 Drawing Sheets

BONDING FIXTURE

CROSS-REFERENCE TO RELATED APPLICATION(S)

The present application claims priority to and the benefit of U.S. Provisional Application No. 63/187,845, filed May 12, 2021, entitled "GLASS BONDING FIXTURE FOR III-V ON SILICON PIC", the entire content of which is incorporated herein by reference.

FIELD

One or more aspects of embodiments according to the present disclosure relate to fabrication of photonic integrated circuits, and more particularly to a fixture for use in bonding components to a photonic integrated circuit.

BACKGROUND

In a chip-assembly process in which III-V components are bonded to each of a plurality of photonic integrated circuits (PICs) on a wafer, bowing of the wafer may lead to misalignment, e.g., tilt, which may compromise the performance of the PICs.

It is with respect to this general technical environment that aspects of the present disclosure are related.

SUMMARY

According to an embodiment of the present disclosure, there is provided a fixture for holding a wafer, the fixture including: a plate for supporting a central region of the wafer, the central region including 80% of the area of the wafer; and a frame for supporting: the edge of the wafer, and the edge of the plate, the frame having: a first vacuum passage, for pulling the wafer against an upper surface of the frame, and a second vacuum passage, for pulling the plate against the frame.

In some embodiments, the fixture further includes a third vacuum passage, for pulling the wafer against the plate.

In some embodiments, the third vacuum passage is in fluid communication with a groove in the plate.

In some embodiments, the groove in the plate is a straight, diametrical groove in the surface of the plate facing the wafer.

In some embodiments, the plate fits into a recess in the frame, a lower surface of the plate abutting against a shelf at the bottom of the recess.

In some embodiments, the third vacuum passage is connected to a hole in a wall of the recess.

In some embodiments, the upper surface of the plate is below the upper surface of the frame.

In some embodiments, the upper surface of the plate is below the upper surface of the frame by at most 30 microns.

In some embodiments, the second vacuum passage is for pulling the plate against the shelf, and the second vacuum passage is connected to a hole in the shelf.

In some embodiments, the shelf is flat to within 5 microns.

In some embodiments, the upper surface of the frame is flat to within 5 microns.

In some embodiments, the first vacuum passage is connected to a hole in the upper surface of the frame.

In some embodiments, the frame is composed of metal.

In some embodiments, the frame is composed of stainless steel.

In some embodiments, the plate is transparent at a wavelength between 0.8 micron and 11 microns.

In some embodiments, the plate is composed of borosilicate glass.

In some embodiments, the plate has a thickness of between 2 mm and 12 mm.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of a bonding fixture provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

In the process of manufacturing a photonic integrated circuit (PIC) that includes one or more bonded components (e.g., a silicon photonic integrated circuit that includes, bonded to it, III-V components such as III-V lasers or III-V modulators) a laser may be used to bond the components to a wafer including a plurality of such photonic integrated circuits. The photonic integrated circuit may include one or more optical waveguides for guiding light on the photonic integrated circuit, and some of the waveguides on the photonic integrated circuit may be coupled to corresponding waveguides on the bonded components. If the alignment between the waveguides on the photonic integrated circuit and the waveguides on the bonded components is poor, or if excessive stresses are introduced, the performance or reliability of the photonic integrated circuit may be degraded.

If, when the bonding operation is performed, the wafer is not flat, e.g., if it has a bow, tilt and misalignment (and performance degradation of the photonic integrated circuit) may result. A silicon wafer may have a bow of about 60 microns, which may be caused in part by thermal stresses introduced by a soldering process, as discussed in further detail below, and which may be greatest (e.g., have the smallest radius of curvature), near the center of the wafer. This bow, if not compensated for, may cause significant performance or reliability degradation of the photonic integrated circuit. In some embodiments a metal support with ribs may be used to flatten the wafer 100 (by pressing the ribs against the wafer during the bonding operation). Such a procedure may, however, require that the wafer 100 be positioned such that the ribs do not obstruct the access of the laser beam to the bonding sites; this positioning operation may be time-consuming. The wafer may have a diameter of between 100 mm and 250 mm.

Figure 1:
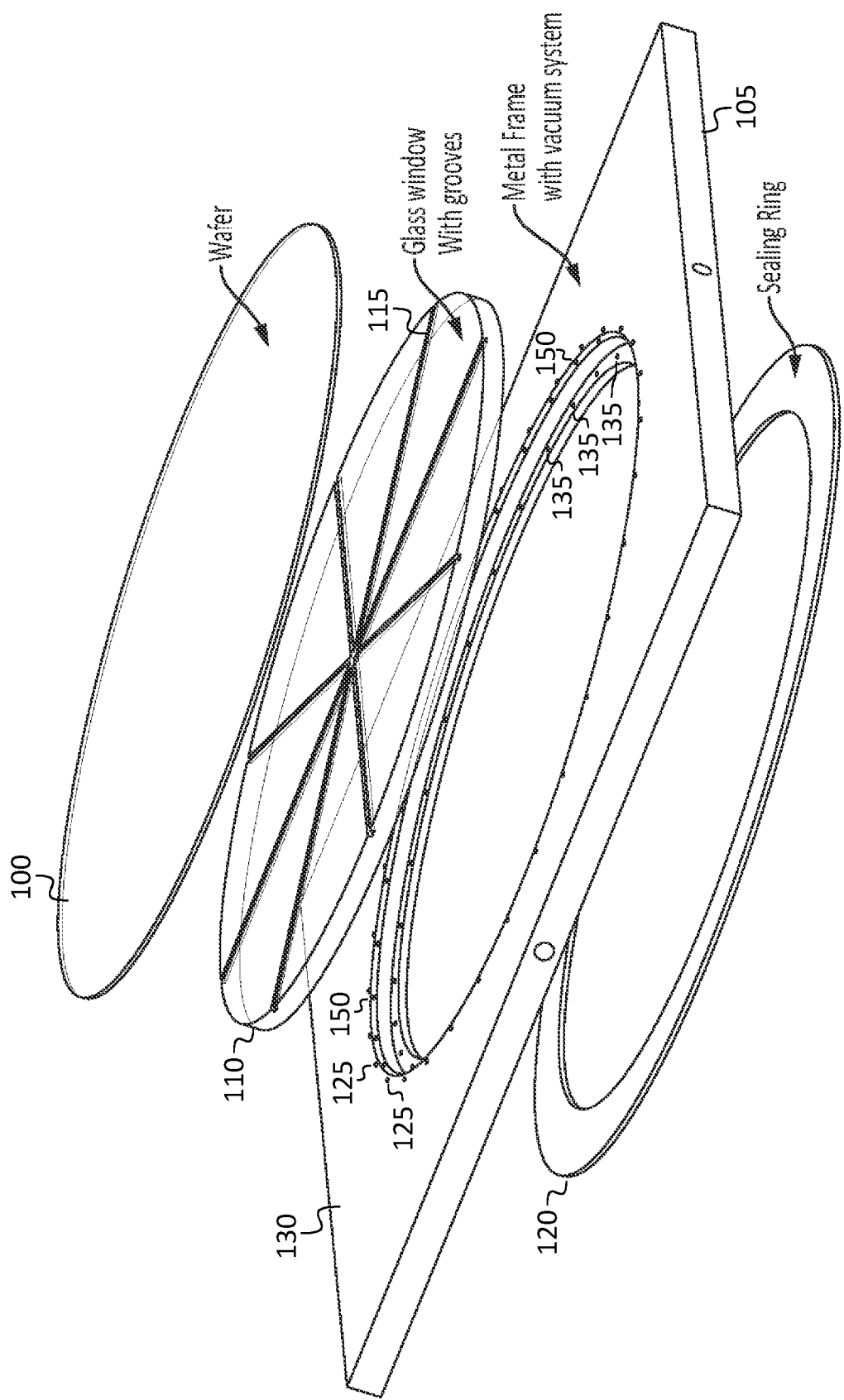
FIG. 1 is a perspective view of a bonding fixture and a wafer, according to an embodiment of the present disclosure.

In some embodiments, therefore, a bonding fixture is used to flatten the wafer 100 while the bonding operation is performed. FIG. 1 shows an exploded perspective view of such a fixture, in some embodiments, and of a wafer 100 that may be used with the fixture. The fixture includes a frame 105, a plate 110 (e.g., a glass window with grooves 115, as illustrated and as discussed in further detail below), and a sealing ring 120. A plurality of first holes 125 in an upper surface 130 of the frame may be employed to pull the wafer 100 against the upper surface 130 of the frame 105, and a plurality of second holes 135 in a shelf 140 at the bottom of a recess 145 (FIG. 2A) in the frame 105 may be employed to pull the plate 110 against the shelf 140. A plurality of third holes 150 may be employed to evacuate the space between the plate 110 and the wafer 100.

Figure 2A:
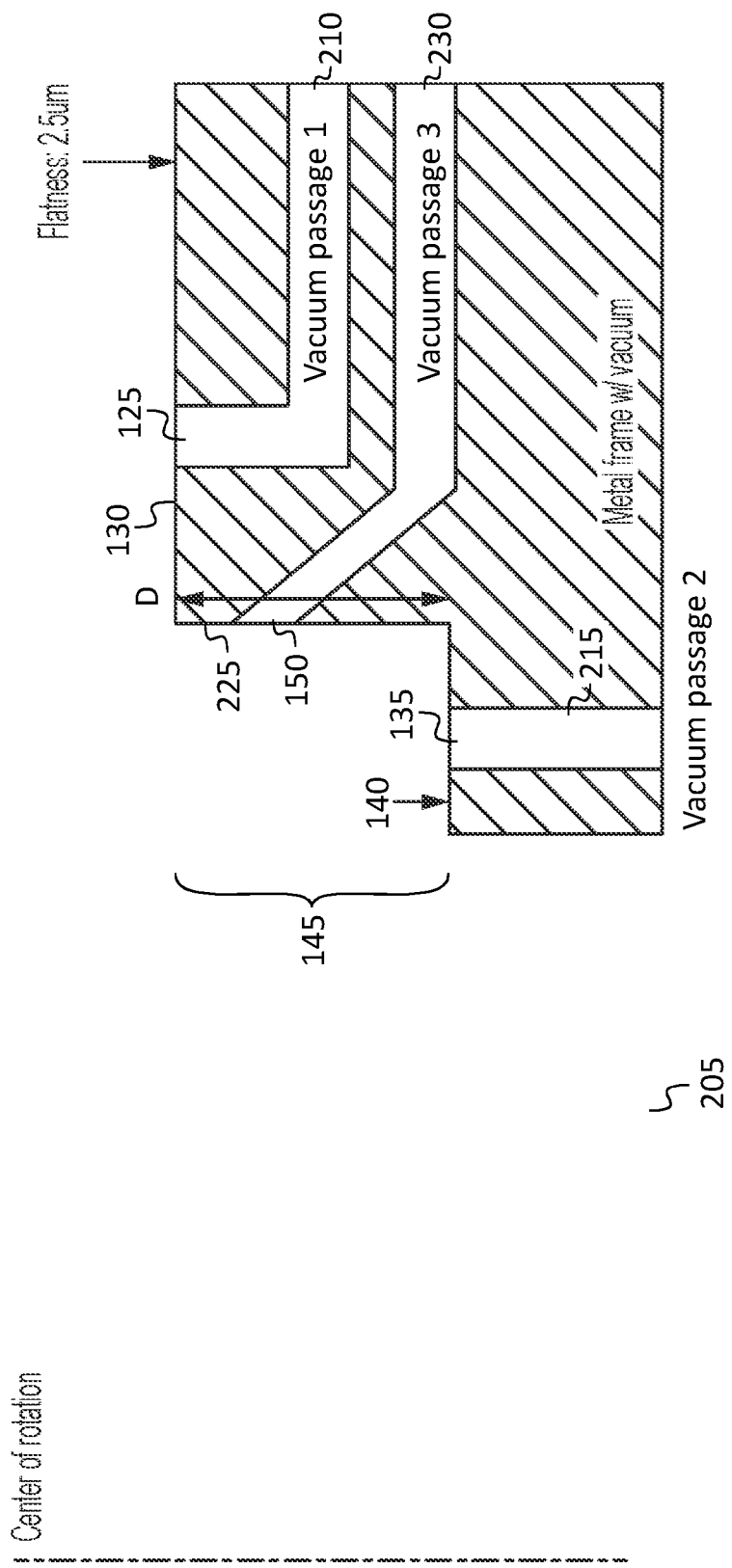
FIG. 2A is a cross-sectional view of a portion of a bonding fixture, according to an embodiment of the present disclosure.

FIG. 2A is a schematic cross-sectional view of the frame 105. The frame 105 has a central (cylindrical) hole forming an aperture 205. The cylindrical recess 145, which has a larger diameter than the aperture 205, extends to a depth D from the upper surface 130 of the frame 105. The bottom surface of the recess 145 forms a shelf 140, as mentioned above. Each first hole 125 opens into (e.g., is connected to) a first vacuum passage 210 (or into a respective first vacuum passage 210 of a plurality of first vacuum passages 210), and each second hole 135 opens into (e.g., is connected to) a second vacuum passage 215 (or into a respective second vacuum passage 215 of a plurality of second vacuum passages 215). FIG. 2A also shows a third hole 150 in the wall 225 of the recess 145, of a plurality of third holes that may be spaced around the wall 225 of the recess 145, each of which opens into (e.g., is connected to) a third vacuum passage 230 (or into a respective third vacuum passage 230 of a plurality of third vacuum passages 230). The frame may be composed of metal, e.g., of stainless steel. Each of the holes 125, 135, 150 may have a diameter between 1 mm and 2 mm, e.g., about 1.5 mm)

Figure 2B:
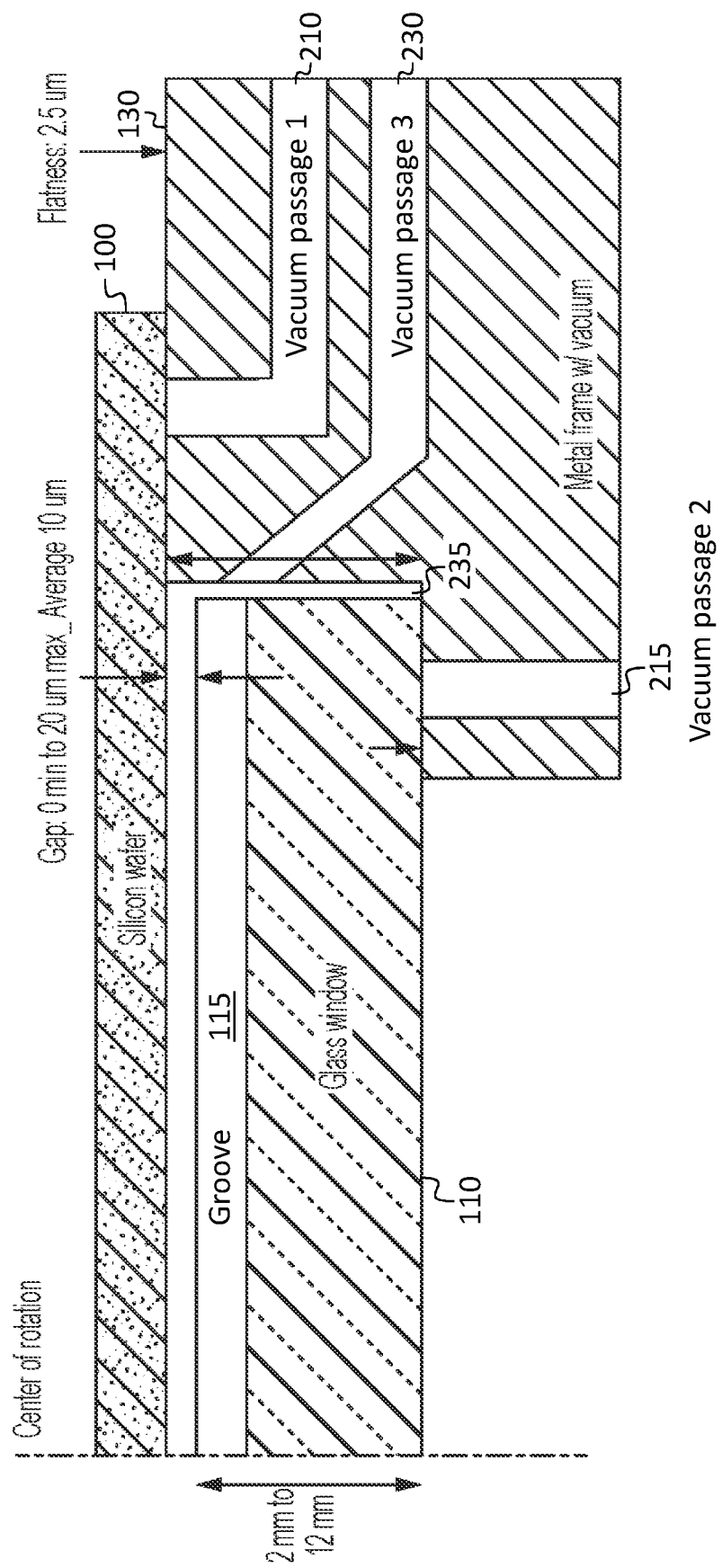
FIG. 2B is a cross-sectional view of a portion of a bonding fixture and a wafer, according to an embodiment of the present disclosure.

FIG. 2B is a cross-sectional view of the bonding fixture in operation. The plate 110 fits into the recess 145, abutting against the shelf 140, and the wafer 100 abuts against the upper surface 130 of the frame 105. The plate covers each of the second holes 135, so that when vacuum is pulled on the second vacuum passage (or passages) 215, the plate 110 is pulled against the frame 105 (e.g., against the shelf 140 of the frame 105). The wafer 100 abuts against the upper surface 130 of the frame 105 and covers each of the first holes 125 so that when vacuum is pulled on the first vacuum passage (or passages) 210, the wafer 100 is pulled against the frame 105 (e.g., against the upper surface 130 of the frame 105). The thickness of the plate 110 is no greater than the depth D of the recess 145, and it may be as much as 20 microns thinner (e.g., 10 microns thinner) than the depth D of the recess 145, so that the upper surface of the plate 110 is at the same height as, or below, the upper surface 130 of the frame 105. As such, the gap between the plate 110 and the wafer 100 may, when vacuum is applied and the wafer 100 is pulled against the plate 110, have a width (measured in the vertical direction in FIG. 2B) of between 0 microns and 30 microns (e.g., between 0 microns and 20 microns), as shown in FIG. 2B. Each of the third holes 150 opens into a gap 235 between the wall 225 of the recess 145 and the edge of the plate 110, so that when vacuum is pulled on the third vacuum passage (or passages) 230, the gap 235 is evacuated, and the grooves 115 (which are in fluid communication with the third vacuum passage (or passages) 230) are evacuated, pulling the wafer 100 against the plate 110. A vacuum having a residual pressure between 50 and 300 mbar may be used, so that the pressure available for flattening the wafer 100, if the other surface of the wafer 100 is exposed to gas (e.g., air) at 1 atmosphere (1000 mbar), may be between 700 mbar and 950 mbar.

The shelf 140 may be flat to a flatness value between 1 micron and 10 microns (e.g., to 2.5 microns or to 5 microns), so that the plate 110, when pulled against the shelf 140 may be similarly flat. The upper surface 130 of the frame 105 may also be flat to a flatness value between 1 micron and 10 microns (e.g., to 2.5 microns or to 5 microns) so that, when the wafer 100 is pulled against (i) the upper surface 130 of the frame 105 and (ii) the plate 110, it may be similarly flat. In some embodiments, a circular groove in the shelf connects the second holes 135, or a circular groove in the upper surface 130 of the frame 105 connects the first holes 125. In operation, a laser may illuminate the photonic integrated circuit from below. The substrate of the photonic integrated circuit may be substantially transparent to the wavelength of the laser, which may heat and melt high-temperature solder between the photonic integrated circuit and the bonded components, soldering the bonded components to the photonic integrated circuit. The overlap between the wafer 100 and the frame 105 may be sufficiently small that most of the wafer (e.g., between 80% of the area of the wafer 100 and 99% of the area of the wafer) remains accessible to the laser.

Figure 3B:
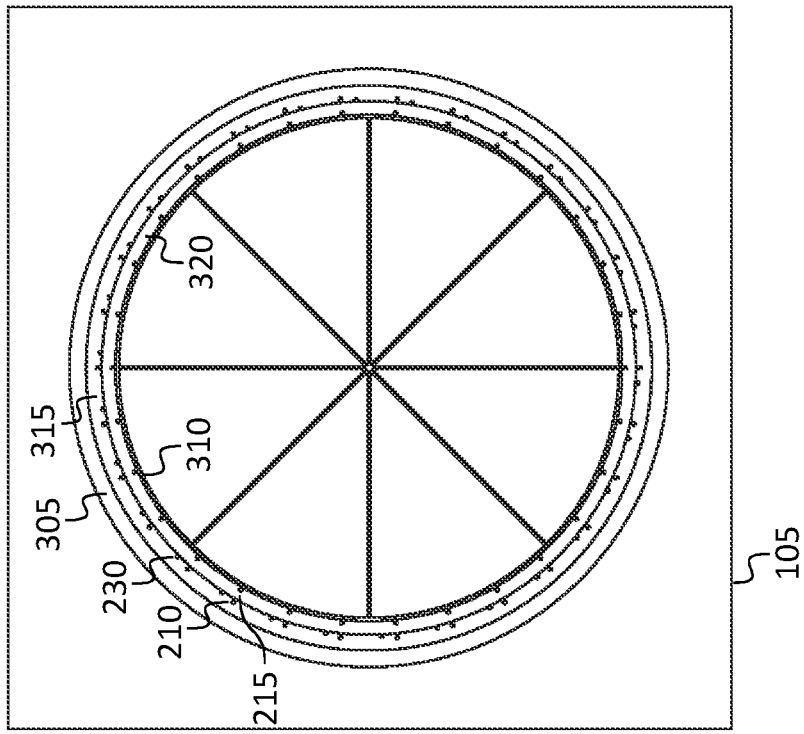
FIG. 3B is a bottom view of a portion of a bonding fixture, according to an embodiment of the present disclosure
Figure 3A:
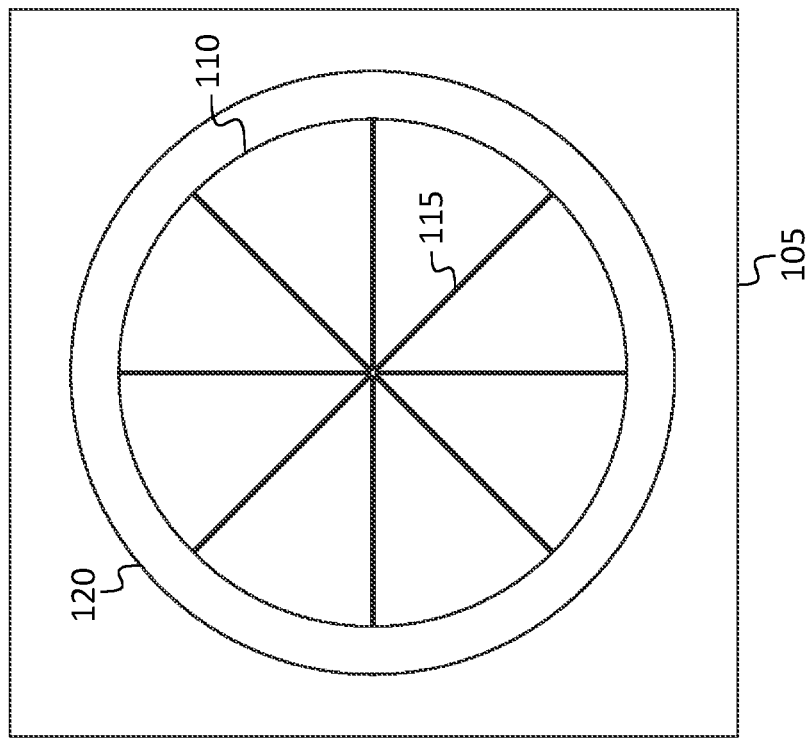
FIG. 3A is a bottom view of a portion of a bonding fixture, according to an embodiment of the present disclosure.

FIGS. 3A and 3B show bottom views of the bonding fixture with (FIG. 3A) and without (FIG. 3B) the sealing ring 120. In the embodiment of FIGS. 3A and 3B the configuration of the vacuum passages is different from that of FIGS. 2A and 2B. As may be seen in FIG. 3B, each vacuum passage is a straight hole extending through the frame (and opening, at the top, into a hole 125, 135, 150, visible in the perspective view of FIG. 1). The bottom of the frame 105 has machined into it a cylindrical recess 305 into which the sealing ring 120 may be brazed. The sealing ring 120 may also be brazed to a cylindrical wall 310, so that the volume between the sealing ring 120 and recessed surfaces 315, 320 forms a vacuum manifold for evacuating the vacuum passages 210, 215, 230. The outer portion of the channel forming the manifold (the portion over the outer recessed surface 315) may be deeper than the inner portion of the channel forming the manifold (the portion over the inner recessed surface 320); this may make it possible for the first vacuum passage 210 and the third vacuum passage 230 to be shorter than they would be if the depth of both portions were the same.

Figure 4B:
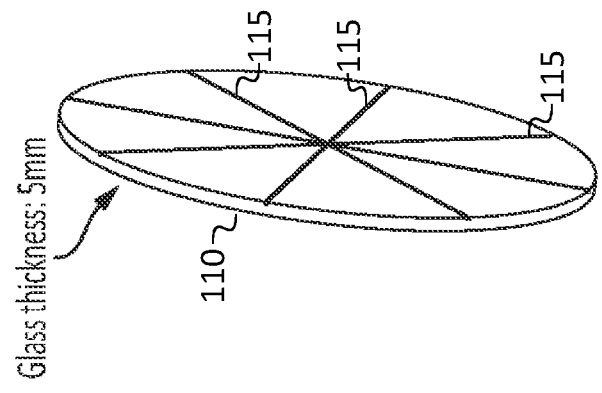
FIG. 4B is a perspective view of a portion of a bonding fixture, according to an embodiment of the present disclosure. Each of FIGS. 1, 3A, 3B, 4A, and 4B is drawn to scale, for a respective embodiment.
Figure 4A:
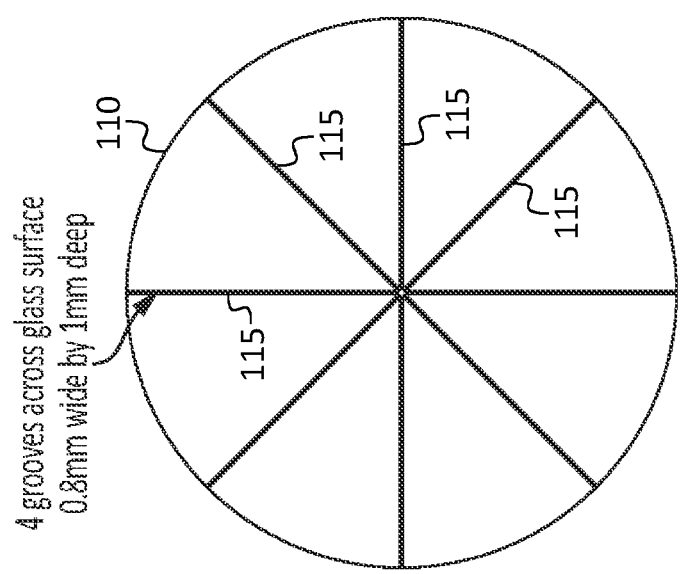
FIG. 4A is a top view of a portion of a bonding fixture, according to an embodiment of the present disclosure.

FIGS. 4A and 4B show a plan view and a perspective view, respectively, of the plate 110. The plate may be composed of a material that is transparent to the light generated by the laser used for the bonding operation. For example, the plate 110 may be composed of borosilicate glass. In some embodiments, the laser emits light at a wavelength between 0.8 micron and 11 microns, and the plate 110 is transparent (e.g., attenuates the light by at most 3 dB on transmission) at the operating wavelength of the laser. The thickness of the plate may be between 2 mm and 12 mm (e.g., it may be about 5 mm). The grooves 115 may be straight grooves each extending diametrically across the surface of the plate 110 as shown, or they may be otherwise arranged, e.g., a set of parallel grooves may be employed, or several sets of parallel grooves, at oblique angles to each other, or two sets of parallel grooves at right angles to each other, may be used. The grooves 115 may have flat, horizontal bottoms, (e.g., each groove 115 may have a rectangular cross section) and the laser light may be able to propagate through any point on the plate 110 while preserving sufficiently good beam quality to perform the soldering operation (including in a situation in which a portion of the laser beam is transmitted through a groove 115 and the remainder of the beam is transmitted through a portion of the plate adjacent to a groove 115). The frame 105 and the plate 110 may be fabricated to be adequately flat using processes such as grinding, lapping and polishing. The bottom surface of each groove 115 may be made smooth (so as to transmit the laser beam without unacceptable attenuation or distortion) by polishing using a mechanical polishing method or using etching. The dimensions of the grooves 115 may be in a range of 0.3 mm to 2 mm wide by 0.3 mm to 3 mm deep. The flatness of the top surface of the plate 110 may be 2.5 um or better. The plate 110 may be in different shapes: circular, square, rectangular or any other shape. The number of grooves may be in a range of 1 to 20; e.g., there may be four grooves as illustrated, e.g., in FIGS. 4A and 4B. The grooves 115 may be smooth and polished and provide access to the laser beam from the bottom side and directly to the soldering spots.

As used herein, "a portion of" something means "at least some of" the thing, and as such may mean less than all of, or all of, the thing. As such, "a portion of" a thing includes the entire thing as a special case, i.e., the entire thing is an example of a portion of the thing. As used herein, when a second quantity is "within Y" of a first quantity X, it means that the second quantity is at least X−Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items. As used herein, any structure or layer that is described as being "made of" or "composed of" a substance should be understood (i) in some embodiments, to contain that substance as the primary component or (ii) in some embodiments, to contain that substance as the major component.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

Although exemplary embodiments of a bonding fixture have been specifically described and illustrated herein, many modifications and variations will be apparent to those skilled in the art. Accordingly, it is to be understood that a bonding fixture constructed according to principles of this disclosure may be embodied other than as specifically described herein. The invention is also defined in the following claims, and equivalents thereof.

What is claimed is:

1. A fixture for holding a wafer, the fixture comprising:
 a plate for supporting a central region of the wafer, the central region including 80% of an area of the wafer; and
 a frame for supporting:
  an edge of the wafer, and
  an edge of the plate,
 the frame having:
  a first vacuum passage, for pulling the wafer against an upper surface of the frame, and
  a second vacuum passage, for pulling the plate against the frame,
 wherein the plate is shaped and sized such that an uppermost surface of the plate is lower than an uppermost surface of the frame when the plate is supported by the frame.

2. The fixture of claim 1, wherein the fixture further comprises a third vacuum passage, for pulling the wafer against the plate.

3. The fixture of claim 2, wherein the third vacuum passage is in fluid communication with a groove in the plate.

4. The fixture of claim 3, wherein the groove in the plate is a straight, diametrical groove in a surface of the plate facing the wafer.

5. The fixture of claim 2, wherein the plate fits into a recess in the frame, a lower surface of the plate abutting against a shelf at the bottom of the recess.

6. The fixture of claim 5, wherein the third vacuum passage is connected to a hole in a wall of the recess.

7. The fixture of claim 5, wherein the second vacuum passage is for pulling the plate against the shelf, and the second vacuum passage is connected to a hole in the shelf.

8. The fixture of claim 5, wherein the shelf is flat to within 5 microns.

9. The fixture of claim 1, wherein the upper surface of the plate is below the upper surface of the frame by at most 30 microns.

10. The fixture of claim 1, wherein the upper surface of the frame is flat to within 5 microns.

11. The fixture of claim 1, wherein the first vacuum passage is connected to a hole in the upper surface of the frame.

12. The fixture of claim 1, wherein the frame is composed of metal.

13. The fixture of claim 12, wherein the frame is composed of stainless steel.

14. The fixture of claim 1, wherein the plate is transparent at a wavelength between 0.8 micron and 11 microns.

15. The fixture of claim 14, wherein the plate is composed of borosilicate glass.

16. The fixture of claim 1, wherein the plate has a thickness of between 2 mm and 12 mm.

17. A fixture for holding a wafer, the fixture comprising:
a plate for supporting a central region of the wafer, the central region including 80% of an area of the wafer; and
a frame for supporting:
an edge of the wafer, and
an edge of the plate,
the frame having:
a first vacuum passage, for pulling the wafer against an upper surface of the frame, and
a second vacuum passage, for pulling the plate against the frame,
wherein the frame has a recess defined at least in part by a bottom shelf and by a sidewall, the sidewall being connected between the bottom shelf and the upper surface of the frame, and
wherein the fixture further comprises a third vacuum passage that is connected to a hole in the sidewall.

* * * * *